(12) United States Patent
Park

(10) Patent No.: US 7,030,671 B2
(45) Date of Patent: Apr. 18, 2006

(54) CIRCUIT FOR CONTROLLING PULSE WIDTH

(75) Inventor: Mun Phil Park, Namyangiu-Shi (KR)

(73) Assignee: Hynix Semiconductor Inc., Kyungki-Do (KR)

(*) Notice: Subject to any disclaimer, the term of this patent is extended or adjusted under 35 U.S.C. 154(b) by 7 days.

(21) Appl. No.: 10/882,600

(22) Filed: Jun. 30, 2004

(65) Prior Publication Data

US 2005/0122148 A1 Jun. 9, 2005

(30) Foreign Application Priority Data

Dec. 5, 2003 (KR) .................. 10-2003-0088283

(51) Int. Cl.
*H03K 5/04* (2006.01)

(52) U.S. Cl. ............................. 327/172; 327/175

(58) Field of Classification Search ......... 327/172–178
See application file for complete search history.

(56) References Cited

U.S. PATENT DOCUMENTS 5,646,565 A * 7/1997 Tukidate .................. 327/174
5,740,123 A * 4/1998 Uchida .................... 365/233
6,901,528 B1 * 5/2005 Rangam .................. 713/501

FOREIGN PATENT DOCUMENTS

KR 2000-0004529 1/2000

OTHER PUBLICATIONS

Korean Office Action for Korean Patent Application No. 2003-88283 dated Aug. 31, 2005.

* cited by examiner

*Primary Examiner*—Dinh T. Le
(74) *Attorney, Agent, or Firm*—Marshall, Gerstein & Borun LLP

(57) ABSTRACT

The present invention discloses a circuit for controlling a pulse width including a frequency detection circuit for extracting an operation frequency band by receiving an external clock, delaying the external clock for a different time and comparing a frequency of the external clock with frequencies of the external clocks delayed for the different time, respectively, and outputting a plurality of mode signals according to the operation frequency band; and a pulse generation circuit for generating a pulse having its width varied by the operation frequency, by using a delay time based on the plurality of mode signals from the frequency detection circuit. As a result, the circuit for controlling the pulse width can be applied to a next generation standard DRAM such as a high speed DDR2 or DDR3 as well as a high speed graphic DRAM for supporting various operation frequencies.

12 Claims, 6 Drawing Sheets

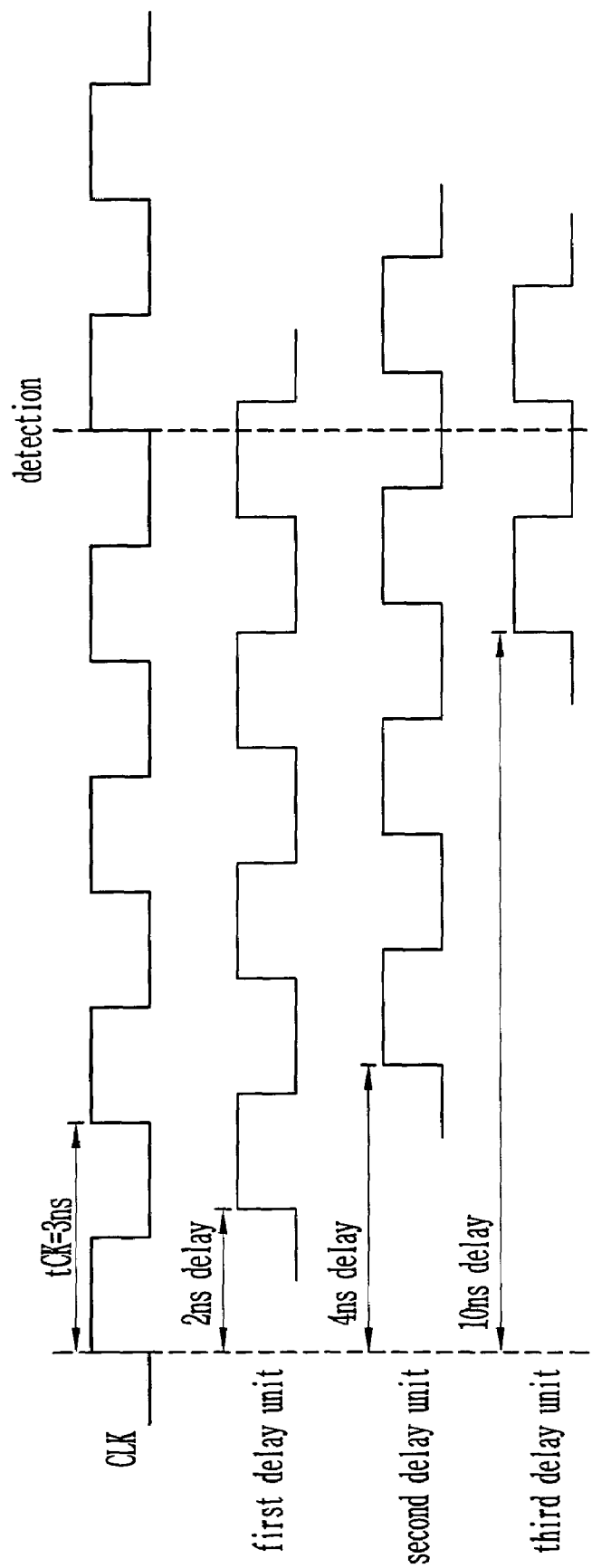

CIRCUIT FOR CONTROLLING PULSE WIDTH

BACKGROUND

1. Field of the Invention

The present invention relates to a circuit for controlling a pulse width, and more particularly to, a circuit for controlling a pulse width of a column address select signal.

2. Discussion of Related Art

Recently, a high speed DRAM or DDR has been used in a graphic field. A pulse width, especially a pulse width of a column address select signal remarkably influences an operation of the device.

The DRAM for graphic operated in various domains of low frequency to high frequency has a very wide operation frequency domain, which causes many problems. Especially, the column address select signal must have an appropriate pulse width for each operation frequency so that DRAM data can be stably read and written. It is thus very important to control the pulse width of the column address select signal according to the operation frequency. In general, the pulse width of the column address select signal is preset as a predetermined value or controlled by an external clock.

A method for setting a pulse width of a column address select signal as a predetermined value generates a predetermined width of pulse regardless of tCK, namely a frequency. However, a standard for controlling the pulse width is ambiguous. When the pulse width is set at a low frequency, tCCD or tWTR is generated in a high frequency operation, to cause operation failure. Conversely, when the pulse width is set at a high frequency, the pulse width is too narrow to deteriorate tWR. Accordingly, data are not sufficiently written on a DRAM cell.

A method for controlling a column address select signal according to an external clock is not sensitive to variations of a process, voltage and temperature, and thus is relatively stable at a high frequency. However, the column address select signal has a narrow pulse width corresponding to half of a pulse width of the external clock. Differently from a DDR1, a DDR2 SDRAM maintains 2tCK of tCCD, and thus the column address select signal has a pulse width larger than half of the pulse width of the external clock (maximally, two times). Therefore, the DDR2 SDRAM cannot increase an operational margin. In addition, when the column address select signal is controlled according to the external clock, the pulse width of the column address select signal is large enough at a low frequency to cause problems in a normal operation or a test.

SUMMARY OF THE INVENTION

The present invention is directed to a circuit for controlling a pulse width which can solve the above problems by generating a pulse width varied by an operation frequency.

The present invention is also directed to a circuit for controlling a pulse width which can contribute to a stable operation of a DRAM by installing a frequency detection circuit in a delay locked loop block, distinguishing an operation frequency by the frequency detection circuit, and setting an optimum pulse width.

In accordance with the present invention, a frequency detection circuit is installed in a delay locked loop block, for detecting an operation frequency by receiving an external clock and comparing tCK of the external clock with tCK of the external clock delayed for a predetermined time, and outputting a high mode signal, a middle mode signal, a low mode signal and a test mode signal for representing different frequency domains to a pulse width control unit of a pulse generation circuit. The number of the output signals can be increased or decreased. The pulse generation circuit receiving the signals outputs a column address select signal having its pulse width optimized by a delay path allocated to each mode.

On the other hand, the frequency detection circuit divides frequency domains for detection, and forms delay unit as many as the domains. Here, each of the delay unit has the same delay time as tCK to be distinguished. The external clock and the external clock passing through the delay unit are transmitted to a positive edge triggered flip-flop, and values thereof are compared and outputted.

One aspect of the present invention is to provide a circuit for controlling a pulse width including: a frequency detection circuit for extracting an operation frequency band by delaying an external clock for a different time and comparing a frequency of the external clock with frequencies of the external clocks delayed for the different time, respectively, and outputting a plurality of mode signals according to the operation frequency band; and a pulse generation circuit for generating a pulse having its width varied by the operation frequency, by using a delay time based on the plurality of mode signals from the frequency detection circuit.

The frequency detection circuit includes: a plurality of delay unit for each respectively delaying an external clock for a different time; a plurality of flip-flops for generating a plurality of detection signals by comparing the external clock with the output signals from the plurality of delay unit, respectively; and a plurality of encoding unit for generating a plurality of mode signals by encoding the plurality of detection signals from the plurality of flip-flops.

The plurality of delay unit include: a first delay unit having a delay time approximate to tCK of the fastest clock in a target operation frequency domain; and a plurality of second delay unit having a longer delay time than that of the first delay unit.

The flip-flops are positive edge triggered flip-flops.

Each of the flip-flops outputs a high state signal when the delay time of the delay unit is shorter than tCK of the external clock, and outputs a low state signal when the delay time of the delay unit is longer than tCK of the external clock.

The encoding unit include: a plurality of NAND gates; and a plurality of inverters for inverting the output signals from the NAND gates.

The pulse generation circuit includes: a pulse generation unit for generating a pulse according to a plurality of control signals; a latch for latching the pulse generated in the pulse generation unit; a pulse width control unit for controlling the pulse width by delaying the output signal from the latch by using a delay time based on the plurality of mode signals; and a logical means for receiving the output signal from the latch and the signal having its width controlled by the pulse width control unit.

The pulse generation circuit further includes a plurality of delay unit for delaying the pulse generated in the pulse generation unit.

The pulse generation unit includes: a NAND gate for receiving a first control signal and a second control signal; and a NOR gate for generating a pulse by receiving the output signal from the NAND gate and third and fourth control signals.

The pulse width control unit includes: a plurality of delay unit for delaying the signal from the latch; and a switching means coupled respectively to output terminals of the plurality of delay unit and driven by each mode signal from the frequency detection circuit, for setting a delay path.

The switching means includes: a plurality of inverters for inverting the plurality of mode signals, respectively; and a plurality of transmission gates driven by the plurality of mode signals and the output signals from the plurality of inverters, respectively.

The logical means is a NAND gate.

According to another aspect of the present invention, a circuit for controlling a pulse width includes: a plurality of delay unit for each respectively delaying an external clock for a different time; a plurality of flip-flops for generating a plurality of detection signals by comparing the external clock with the output signals from the plurality of delay unit, respectively; a plurality of encoding unit for generating a plurality of mode signals by encoding the plurality of detection signals from the plurality of flip-flops; a pulse generation unit for generating a pulse according to a plurality of control signals; a latch for latching the pulse generated in the pulse generation unit; a pulse width control unit for controlling the pulse width by receiving the output signal from the latch and delaying the signal by using a delay time based on the plurality of mode signals; and a logical means for receiving the output signal from the latch and the output signal from the pulse width control unit.

BRIEF DESCRIPTION OF THE DRAWINGS

A more complete understanding of the present invention may be had by reference to the following description when taken in conjunction with the accompanying drawings in which:

FIG. 3 is a timing diagram showing an operation of the frequency detection circuit of FIG. 2;

DETAILED DESCRIPTION OF PREFERRED EMBODIMENTS

Figure 1:
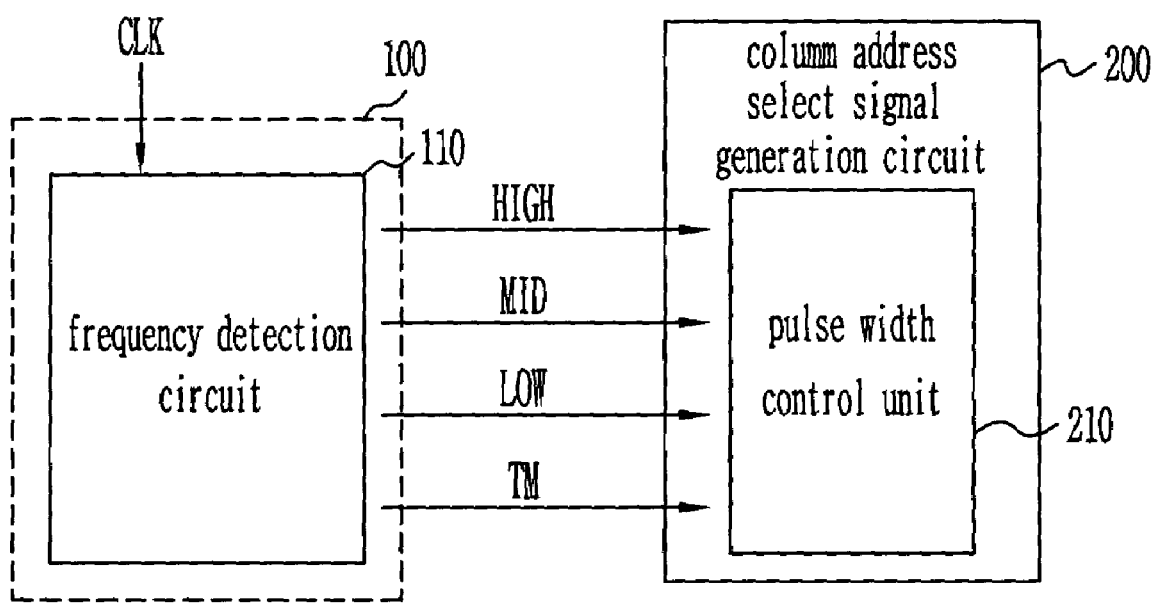
FIG. 1 is a block diagram illustrating a circuit for controlling a pulse width in accordance with a preferred embodiment of the present invention.

A circuit for controlling a pulse width in accordance with a preferred embodiment of the present invention will now be described in detail with reference to the accompanying drawings. Wherever possible, the same reference numerals will be used throughout the drawings and the description to refer to the same or like parts.

FIG. 1 is a block diagram illustrating a circuit for controlling a pulse width of a column address select signal in accordance with a preferred embodiment of the present invention.

Referring to FIG. 1, a frequency detection circuit 110 is installed in a delay locked loop block 100, and a clock CLK is applied to the frequency detection circuit 100. The frequency detection circuit 110 extracts an operation frequency band by comparing tCK of the clock CLK with tCK of the clock CLK passing through a plurality of delay unit set in a different delay time, decodes the operation frequency band, and outputs a plurality of signals according to the operation frequency band. For example, the frequency detection circuit 110 outputs a plurality of mode signals for representing a frequency band, such as high HIGH, middle MID, low LOW and test mode TM. Here, the high mode signal HIGH represents a first frequency band which is the highest, the middle mode signal MID represents a second frequency band which is lower than that of the high mode signal HIGH, the low mode signal LOW represents a third frequency band which is lower than that of the middle mode signal MID, and the test mode signal TM represents a fourth frequency band which is lower than that of the low mode signal LOW. On the other hand, the test mode signal TM represents a test mode executed mostly at a low frequency below 100 MHz, and thus a column address select signal has the largest pulse width. Here, it is notable that the test mode signal TM can be used for both the test mode and the low frequency detection. In this embodiment, four operation modes are exemplified, but a number of the operation modes can be increased or decreased by controlling a number of the delay unit in the frequency detection circuit 110 according to a number of target operation frequency bands.

The four mode signals such as the high mode signal HIGH, the middle mode signal MID, the low mode signal LOW and the test mode signal TM outputted from the frequency detection circuit 110 are inputted to a pulse width control unit 210 of a column address select signal generation circuit 200 with frequency band information, respectively. Each of the mode signals inputted to the pulse width control unit 210 has an inherent delay time and an appropriate pulse width, and thus a column address select signal yi having its pulse width optimized by the operation frequency band is outputted.

Figure 2:
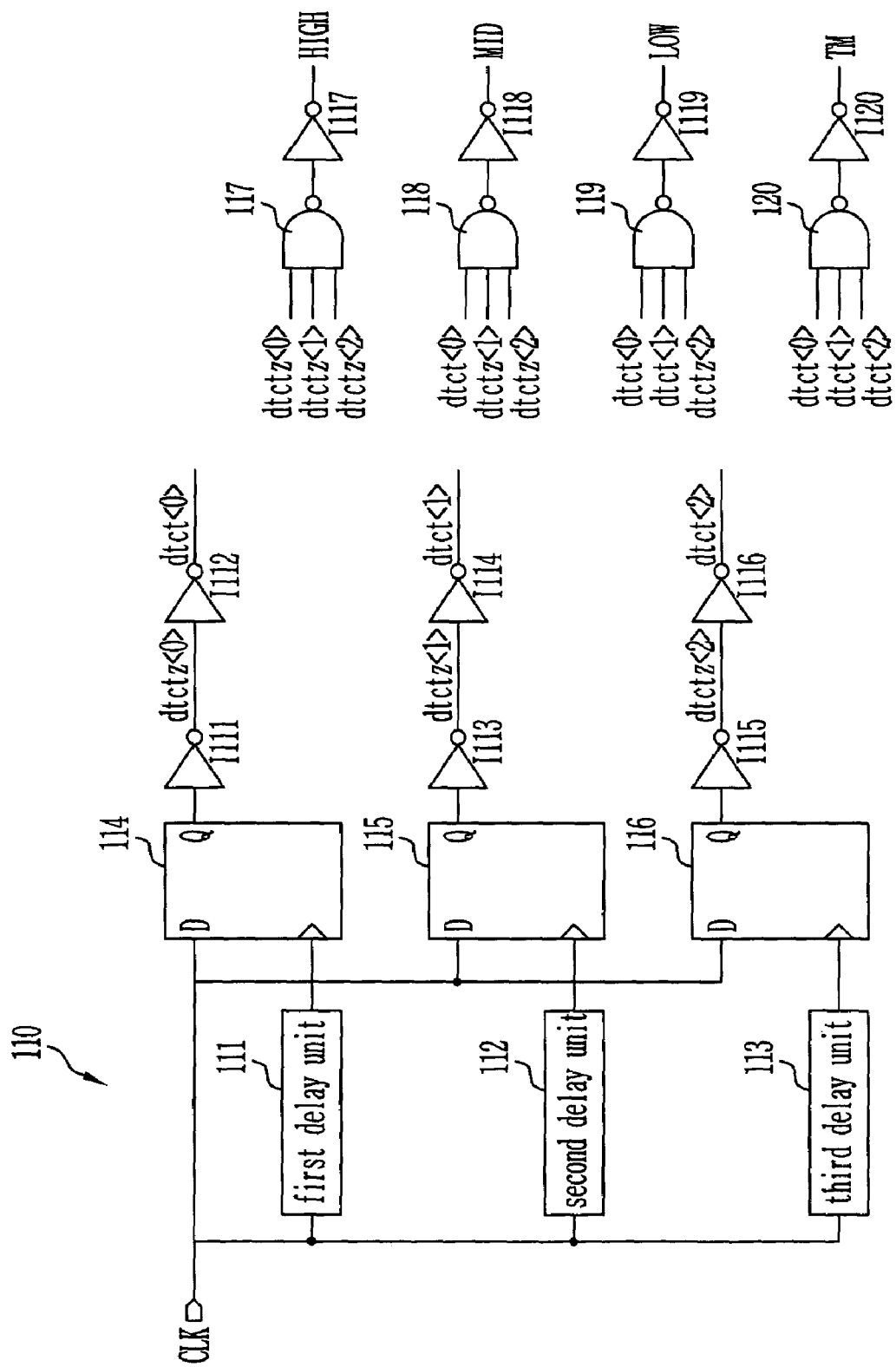
FIG. 2 is a circuit diagram illustrating a frequency detection circuit of FIG. 1.

FIG. 2 is a circuit diagram illustrating the frequency detection circuit of FIG. 1. The structure of the frequency detection circuit will now be explained.

A first delay unit 111 is set to have a shorter delay time than tCK of the clock CLK, and second and third delay unit 112 and 113 are set to have a longer delay time than tCK of the clock CLK. Here, the second delay unit 112 has a shorter delay time than that of the third delay unit 113. For example, when it is presumed that tCK of the clock CLK is 3 ns, the first delay unit 111 is set to have 2 ns of delay time, and the second and third delay unit 112 and 113 are set to have 4 ns of delay time and 10 ns of delay time, respectively. A first flip-flop 114 compares the clock CLK with the clock CLK delayed by the first delay unit 111, a second flip-flop 115 compares the clock CLK with the clock CLK delayed by the second delay unit 112, and a third flip-flop 116 compares the clock CLK with the clock CLK delayed by the third delay unit 113. Here, the first to third flip-flops 114 to 116 are positive edge triggered flip-flops. The output signal from the first flip-flop 114 is outputted as a first detection signal dtct<0> through first and second inverters I111 and I112, the output signal from the second flip-flop 115 is outputted as a second detection signal dtct<1> through third and fourth inverters I113 and I114, and the output signal from the third flip-flop 116 is outputted as a third detection signal dtct<2> through fifth and sixth inverters I115 and I116. A first NAND gate 117 NANDs an inverted signal dtctz<0> of the first detection signal, an inverted signal dtctz<1> of the second detection signal and an inverted signal dtctz<2> of the third detection signal, and a seventh inverter I117 outputs the high mode signal HIGH by inverting the output signal from the first NAND gate 117. A second NAND gate 118 NANDs the first detection signal dtct<0>, the inverted signal dtctz<1> of the second detection signal and the inverted signal dtctz<2> of the third detection signal, and an eighth inverter I118 outputs the middle mode signal MID by inverting the output signal from the second NAND gate 118: A third NAND gate 119 NANDs the first detection signal dtct<0>, the second detection signal dtct<1> and the inverted signal dtctz<2> of the third detection signal, and a ninth inverter I119 outputs the low mode signal LOW by inverting the output signal from the third NAND gate 119. A fourth NAND gate 120 NANDs the first detection signal dtct<0>, the second detection signal dtct<1> and the third detection signal dtct<2>, and a tenth inverter I120 outputs the test mode signal TM by inverting the output signal from the fourth NAND gate 120.

Here, the high mode signal HIGH is a signal for detecting tCK below 2 ns, namely an operation frequency over 500 MHz in 2 ns delay, the middle mode signal MID is a signal for detecting tCK between 2 ns and 4 ns, namely an operation frequency between 250 MHz and 500 MHz in 2 ns delay and 4 ns delay, the low mode signal LOW is a signal for detecting tCK between 4 ns and 10 ns, namely an operation frequency between 100 MHz and 250 MHz in 4 ns delay and 10 ns delay, and the test mode signal TM is a signal for detecting tCK over 10 ns, namely an operation frequency below 100 MHz in 10 ns delay. In this embodiment, the four operation modes are exemplified, but the number of the operation modes can be increased or decreased by controlling the number of the delay unit in the frequency detection circuit according to the number of target operation frequency bands.

The driving method of the frequency detection circuit in accordance with the present invention will now be explained.

FIG. 3 is a timing diagram showing an operational principle of the frequency detection circuit in accordance with the present invention. The frequency detection circuit uses the principle that the outputs from the flip-flops always have a high state when the delay time of the delay unit of the frequency detection circuit is shorter than tCK of the clock CLK, and that the outputs from the flip-flops always have a low state when the delay time of the delay unit is longer than tCK of the clock CLK.

On the other hand, the clock CLK having tCK of 3 ns is applied to the frequency detection circuit, the first delay unit 111 is set to have a delay time of 2 ns, the second delay unit 112 is set to have a delay time of 4 ns, and the third delay unit 113 is set to have a delay time of 10 ns. Accordingly, the output signal from the first delay unit 111 having a shorter delay time than tCK of the clock CLK has a high state at the rising edge of the clock CLK, and the output signals from the second and third delay unit 112 and 113 having a longer delay time than tCK of the clock CLK have a low state at the rising edge of the clock CLK.

The first flip-flop 114 receives the clock CLK and the output signal from the first delay unit 111, detects the output signal from the first delay unit 111 at the rising edge of the clock CLK, and outputs the high state signal. The second flip-flop 115 receives the clock CLK and the output signal from the second delay unit 112, detects the output signal from the second delay unit 112 at the rising edge of the clock CLK, and outputs the low state signal. The third flip-flop 116 receives the clock CLK and the output signal from the third delay unit 113, detects the output signal from the third delay unit 113 at the rising edge of the clock CLK, and outputs the low state signal.

The high state output signal from the first flip-flop 114 is outputted as the first detection signal dtct<0> through the first and second inverters I111 and I112. The low state output signal from the second flip-flop 115 is outputted as the second detection signal dtct<1> through the third and fourth inverters I113 and I114. The low state output signal from the third flip-flop 116 is outputted as the third detection signal dtct<2> through the fifth and sixth inverters I115 and I116.

The first NAND gate 117 NANDs the inverted signal dtctz<0> of the low state first detection signal, the inverted signal dtctz<1> of the high state second detection signal and the inverted signal dtctz<2> of the high state third detection signal, and outputs the high state signal, and the seventh inverter I117 outputs the low state high mode signal HIGH by inverting the high state output signal from the first NAND gate 117. The second NAND gate 118 NANDs the high state first detection signal dtct<0>, the inverted signal dtctz<1> of the high state second detection signal and the inverted signal dtctz<2> of the high state third detection signal, and outputs the low state signal, and the eighth inverter I118 outputs the high state middle mode signal MID by inverting the low state output signal from the second NAND gate 118. The third NAND gate 119 NANDs the high state first detection signal dtct<0>, the low state second detection signal dtct<1> and the inverted signal dtctz<2> of the high state third detection signal, and outputs the high state signal, and the ninth inverter I119 outputs the low state low mode signal LOW by inverting the high state output signal from the third NAND gate 119. The fourth NAND gate 120 NANDs the high state first detection signal dtct<0>, the low state second detection signal dtct<1> and the low state third detection signal dtct<2>, and outputs the high state signal, and the tenth inverter I120 outputs the low state test mode signal TM by inverting the high state output signal from the fourth NAND gate 120.

Figure 4A:
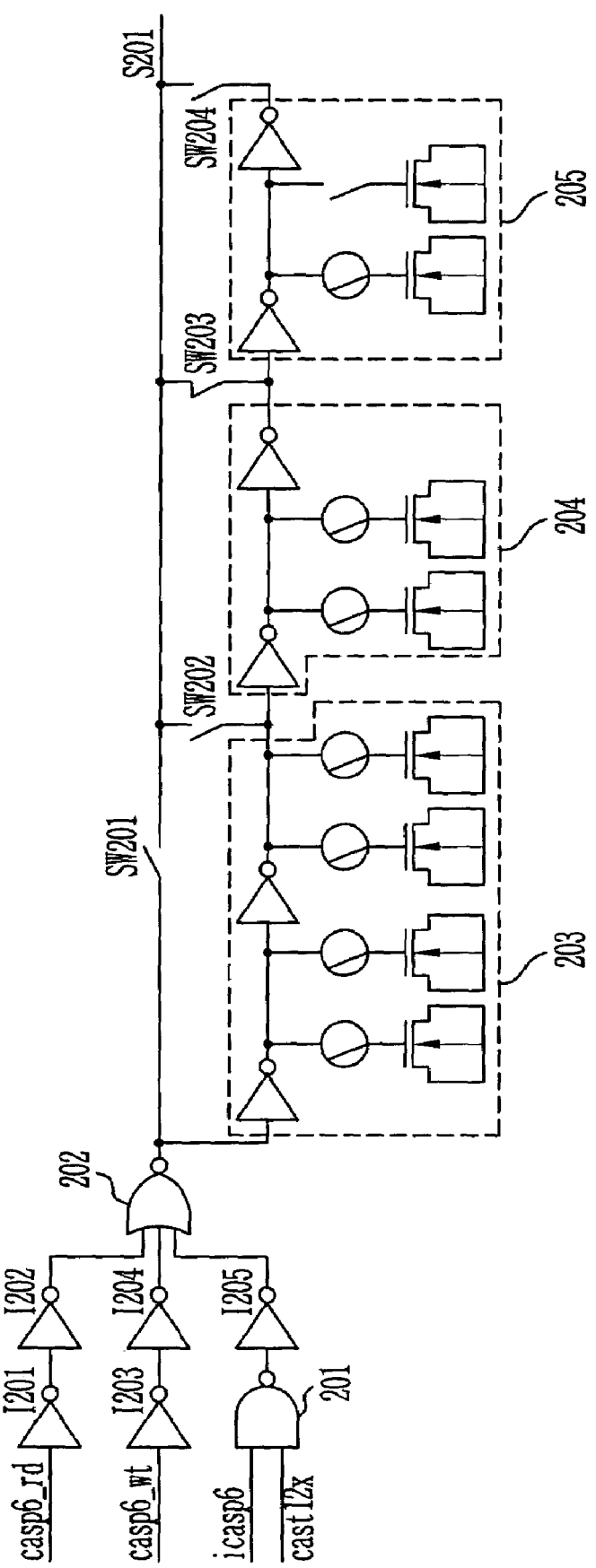
FIGS. 4a and 4b are circuit diagrams illustrating a column address select signal generation circuit in accordance with the preferred embodiment of the present invention.
Figure 4B:
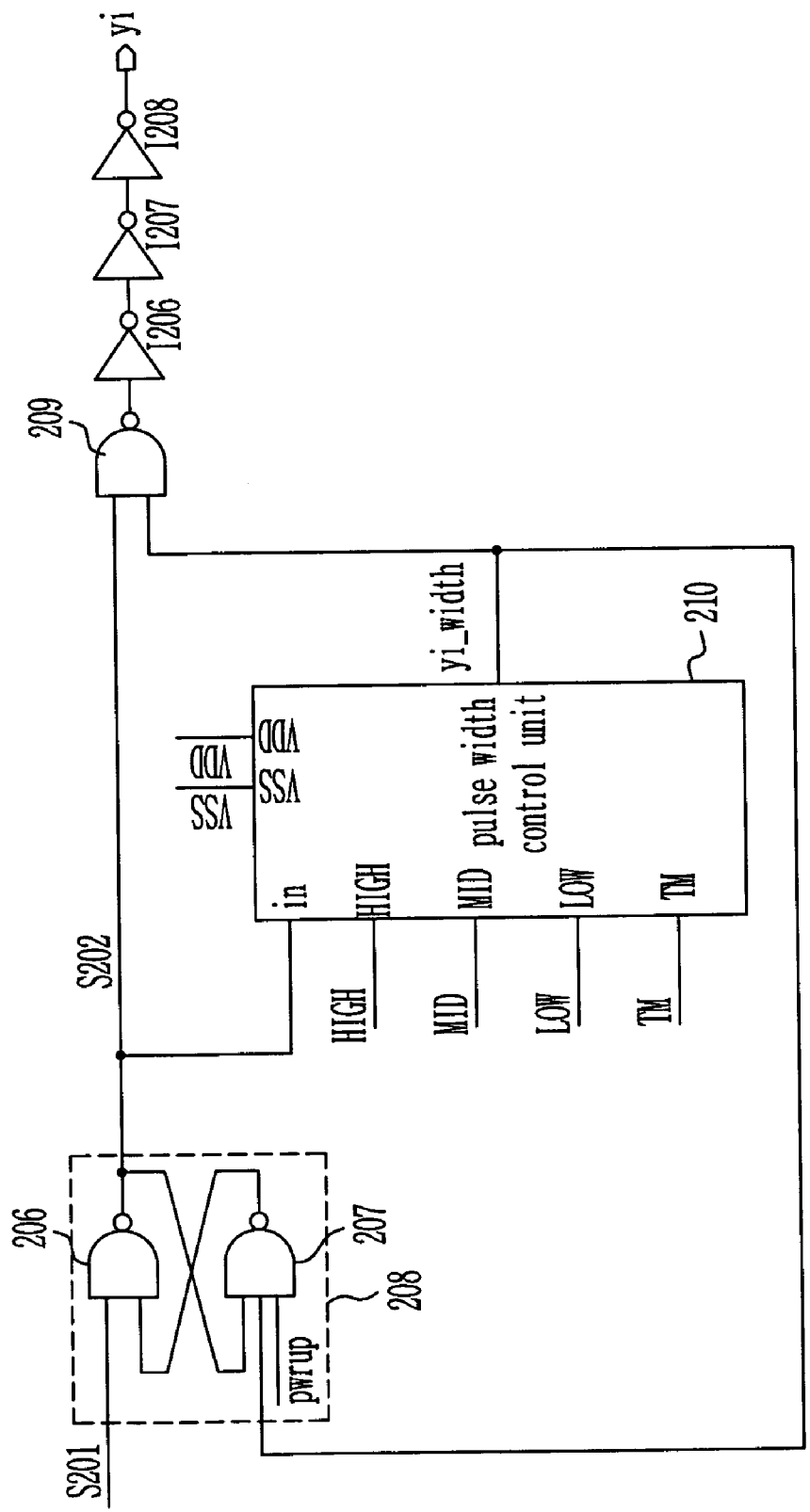

FIGS. 4a and 4b are circuit diagrams illustrating the column address select signal generation circuit in accordance with the preferred embodiment of the present invention. The structure of the column address select signal generation circuit will now be explained.

A first inverter I201 inverts a read column pulse casp6_rd, and a second inverter I202 inverts the output from the first inverter I201. A third inverter I203 inverts a write column pulse casp6_wt, and a fourth inverter I204 inverts the output from the third inverter I203. A first NAND gate 201 NANDs an internal column access pulse icasp6 and a column enable pulse cast12x, and a fifth inverter I205 inverts the output from the first NAND gate 201. A NOR gate 202 NORs the outputs from the second, fourth and fifth inverters I202, I204 and I205. A delay time of the output pulse S201 from the NOR gate 202 is determined by a plurality of delay unit 203, 204 and 205 selectively operated by a plurality of switches SW201 to SW204. A latch 208 including a second NAND gate 206 and a third NAND gate 207 latches the output pulse S201 from the NOR gate 202 and the output signal yi_width from the pulse width control unit 210. Here, the second NAND gate 206 receives the output pulse S201 from the NOR gate 202 and the output signal S203 from the third NAND gate 207, and the third NAND gate 207 receives the output signal S202 from the second NAND gate 206, the output signal yi_width from the pulse width control unit 210 and a power up signal pwrup. The pulse width control unit 210 receives the plurality of mode signals from the frequency detection circuit 110, namely the high mode signal HIGH, the middle mode signal MID, the low mode signal LOW and the test mode signal TM, and delays the output signal S202 from the latch 208 according to the inherent delay time of each mode signal, thereby generating the output pulse yi_width having the controlled pulse width. A fourth NAND gate 209 NANDs the output signal S202 from the latch 208 and the output signal yi_width from the pulse delay unit 210. Sixth to eighth inverters I206 to I208 output the column address select signal yi by inverting and buffering the output signal from the fourth NAND gate 209.

The driving method of the column address select signal generation circuit in accordance with the present invention will now be described.

When receiving the high state read column pulse casp6_rd or the high state write column pulse casp6_wt, or receiving the high state internal column access pulse icasp6 and the high state column enable pulse cast12x at the same time, the NOR gate 202 NORs the pulses and outputs the low state pulse S201. The output pulse S201 from the NOR gate 202 maintaining a low state is inputted to the second NAND gate 206 of the latch 208, and the second NAND gate 206 outputs the high state output signal S202. The output signal S202 from the second NAND gate 206 maintaining a high state is inputted to the third NAND gate 207 and the pulse width control unit 210. When receiving the output signal S202 from the latch 208, the pulse width control unit 210 sets the corresponding path according to the plurality of mode signals from the frequency detection circuit 110. Accordingly, the output signal yi_width having its width controlled by an appropriate delay time based on the mode signals is outputted. In addition, the output signal S202 from the latch 208 and the output signal yi_width from the pulse width control unit 210 are inputted to the fourth NAND gate 209, and the fourth NAND gate 209 NANDs the signals and outputs the low state pulse. The output pulse from the fourth NAND gate 209 maintaining a low state is outputted as the high state column address select signal yi through the sixth to eighth inverters I206 to I208. On the other hand, the output pulse from the pulse width control unit 210 is NANDed in the third NAND gate 207 with the output signal S202 from the second NAND gate 206 and the power up signal pwrup, and the output signal S203 from the third NAND gate 207 is inputted to the second NAND gate 206.

Figure 5:
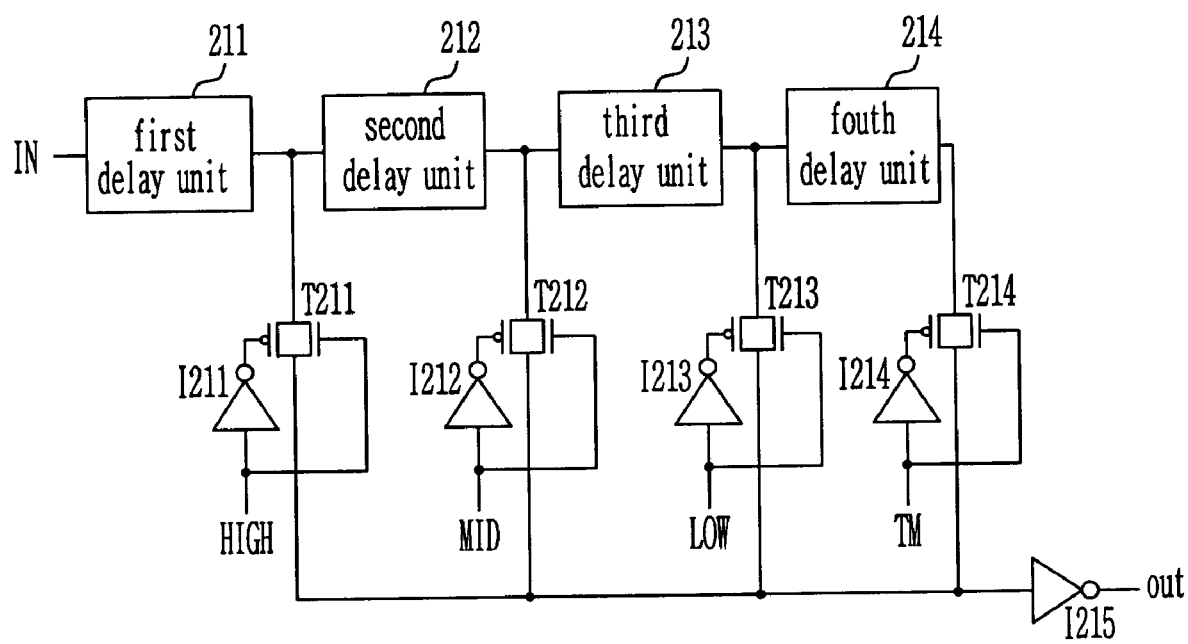
FIG. 5 is a circuit diagram illustrating a pulse width control unit of FIG. 4b.

FIG. 5 is a circuit diagram illustrating the pulse width control unit of FIG. 4*b*.

The pulse width control unit includes a plurality of delay unit 211 to 214 coupled in series for delaying an input signal IN, a plurality of transmission gates T211 to T214 which are switching means driven by each mode signal and each inverted mode signal by inverters I211 to I214, for setting a delay path, and an inverter I215 for inverting the signal delayed by each delay unit 211 to 214.

The pulse width control unit determines the delay path according to the mode signals, and outputs an output signal out. For example, when the middle mode signal MID is applied in a high state and the other mode signals from the clock detection circuit 110 are applied in a low state, the second transmission gate T212 is turned on by the high state middle mode signal MID and the signal inverted to a low state by the second inverter I212. Therefore, the input signal IN is delayed by the first and second delay unit 211 and 212, the delay signal is inverted by the inverter I215, and the inverted signal is outputted as the output signal out. A delay time of the mode signal for detecting a low frequency increases, and thus the pulse width also increases.

As discussed earlier, in accordance with the present invention, the circuit for controlling the pulse width can generate the pulse having its width varied by the operation frequency, by installing the frequency detection circuit in the delay locked loop block, distinguishing the operation frequency of the external clock, and setting the optimum pulse width. As a result, the circuit for controlling the pulse width can be applied to a next generation standard DRAM such as a high speed DDR2 or DDR3 as well as a high speed graphic DRAM for supporting various operation frequencies.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A circuit for controlling a pulse width, comprising:
   a frequency detection circuit for extracting an operation frequency band by generating a plurality of delayed clocks having different delay times by delaying an input clock and comparing a frequency of the input clock with frequencies of the delayed clocks, respectively, and outputting a plurality of mode signals according to the operation frequency band; and
   a pulse generation circuit for generating an output pulse having its width varied in response to the plurality of mode signals outputted from the frequency detection circuit.

2. The circuit of claim 1, wherein the frequency detection circuit comprises:
   a plurality of delay units for generating the plurality of delayed clocks having different delay time by delaying the input clock;
   a plurality of flip-flops for generating a plurality of detection signals by comparing the input clock with the delayed clocks outputted from the plurality of delay units, respectively; and
   a plurality of encoding means for generating the plurality of mode signals by encoding the plurality of detection signals from the plurality of flip-flops.

3. The circuit of claim 2, wherein the flip-flops are positive edge triggered flip-flops.

4. The circuit of claim 2, wherein each of the flip-flops outputs a high state signal when the delay time of the delay unit is shorter than one cycle of the input clock, and outputs a low state signal when the delay time of the delay unit is longer than one cycle of the input clock.

5. The circuit of claim 2, wherein the encoding means comprise:
   a plurality of NAND gates; and
   a plurality of inverters for inverting output signals from the NAND gates.

6. The circuit of claim 1, wherein the pulse generation circuit comprises:
   a first logical means for generating a pulse according to a plurality of control signals;
   a latch for latching the pulse generated in the first logical means;
   a pulse width control unit for controlling a width of the pulse by delaying an output signal from the latch according to the plurality of mode signals; and
   a second logical means for receiving the output signal from the latch and an output signal from the pulse width control unit, and outputting the output pulse.

7. The circuit of claim 6, wherein the pulse generation circuit further comprises a plurality of delay units for delaying the pulse generated in the first logical means.

8. The circuit of claim 6, wherein the first logical means comprises:
   a NAND gate for receiving a first control signal and a second control signal; and
   a NOR gate for generating the pulse by receiving an output signal from the NAND gate and third and fourth control signals.

9. The circuit of claim 6, wherein the pulse width control unit comprises:
   a plurality of delay units for delaying the signal from the latch; and
   a switching means coupled respectively to output terminals of the plurality of delay unit and driven by each mode signal from the frequency detection circuit, for setting a delay path.

10. The circuit of claim 9, wherein the switching means comprises:
   a plurality of inverters for inverting the plurality of mode signals, respectively; and
   a plurality of transmission gates driven by the plurality of mode signals and the output signals from the plurality of inverters, respectively.

11. The circuit of claim 6, wherein the logical means is a NAND gate.

12. A circuit for controlling a pulse width, comprising:
   a plurality of delay units for each respectively delaying a clock for a different time;
   a plurality of flip-flops for generating a plurality of detection signals by comparing the clock with output signals from the plurality of delay units, respectively;
   a plurality of encoding means for generating a plurality of mode signals by encoding the plurality of detection signals from the plurality of flip-flops;
   a pulse generation unit for generating a pulse according to a plurality of control signals;
   a latch for latching the pulse generated in the pulse generation unit, which is connected to an output terminal of the pulse generation unit;
   a pulse width control unit for controlling the pulse width by receiving an output signal from the latch and delaying the signal according to the plurality of mode signals; and
   a logical means for receiving the output signal from the latch and an output signal from the pulse width control unit.

* * * * *

UNITED STATES PATENT AND TRADEMARK OFFICE
CERTIFICATE OF CORRECTION

| | | Page 1 of 1 |
|---|---|---|
| PATENT NO. | : 7,030,671 B2 | |
| APPLICATION NO. | : 10/882600 | |
| DATED | : April 18, 2006 | |
| INVENTOR(S) | : Mun P. Park | |

It is certified that error appears in the above-identified patent and that said Letters Patent is hereby corrected as shown below:

In the Claims:

At Column 9, line 6, "unit" should be -- units --.

Signed and Sealed this
Tenth Day of May, 2011

David J. Kappos
*Director of the United States Patent and Trademark Office*